United States Patent
Wang et al.

(10) Patent No.: US 11,183,513 B1
(45) Date of Patent: Nov. 23, 2021

(54) SEMICONDUCTOR DEVICE AND METHOD FOR FABRICATING THE SAME

(71) Applicant: MACRONIX INTERNATIONAL CO., LTD., Hsinchu (TW)

(72) Inventors: Jr-Meng Wang, Hsinchu County (TW); Cheng-Wei Lin, Taipei (TW); Kuang-Wen Liu, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 2 days.

(21) Appl. No.: 16/865,442

(22) Filed: May 4, 2020

(51) Int. Cl.
| | |
|---|---|
| *H01L 27/11582* | (2017.01) |
| *H01L 27/11524* | (2017.01) |
| *H01L 27/11556* | (2017.01) |
| *H01L 27/11519* | (2017.01) |
| *H01L 27/1157* | (2017.01) |
| *H01L 23/00* | (2006.01) |
| *H01L 23/522* | (2006.01) |
| *H01L 23/528* | (2006.01) |
| *H01L 21/768* | (2006.01) |
| *H01L 27/11565* | (2017.01) |

(52) U.S. Cl.
CPC .. *H01L 27/11582* (2013.01); *H01L 21/76816* (2013.01); *H01L 21/76877* (2013.01); *H01L 23/5226* (2013.01); *H01L 23/5283* (2013.01); *H01L 23/562* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
None
See application file for complete search history.

(56) References Cited

U.S. PATENT DOCUMENTS

| | | | | |
|---|---|---|---|---|
| 10,304,852 B1 * | 5/2019 | Cui | ........... | H01L 27/1157 |
| 2021/0035998 A1 * | 2/2021 | Nishikawa | ........ | H01L 27/11524 |

* cited by examiner

*Primary Examiner* — Hsien Ming Lee
(74) *Attorney, Agent, or Firm* — McClure, Qualey & Rodack, LLP (57) ABSTRACT

A semiconductor device includes a substrate, a stacked structure disposed on the substrate, and dummy memory string structures. The stacked structure includes alternately stacked insulating layers and conductive layers. The dummy memory string structures disposed in a staircase region of the semiconductor device penetrate the stacked structure along a first direction. The staircase region includes a body portion including a first region and a second region adjacent to the first region. In the first region, an amount of conductive layers corresponding to the dummy memory string structures is between 1 and 10; in the second region, an amount of conductive layers corresponding to the dummy memory string structures is greater than 10. An area of the dummy memory string structures in the first region is greater than an area of the dummy memory string structures in the second area under an identical unit area in a top view.

20 Claims, 11 Drawing Sheets

SEMICONDUCTOR DEVICE AND METHOD FOR FABRICATING THE SAME

BACKGROUND OF THE INVENTION

Field of the Invention

The invention relates in general to a semiconductor device and a method for fabricating the same, and more particularly to a three dimensional semiconductor device and a method for fabricating the same.

Description of the Related Art

Recently, as the demand for better memory devices has gradually increased, various three-dimensional (3D) memory devices have been provided, such as 3D NAND memory devices, 3D NOR memory devices or 3D AND memory devices.

Generally, a three-dimensional memory device includes a substrate and a stacked structure disposed on the substrate. The stacked structure includes a plurality of insulating layers and a plurality of conductive layers alternately stacked with the insulating layers. Moreover, the three-dimensional memory device includes an array region and a staircase region adjacent to the array region. Memory string structures and the dummy memory string structures can be formed in the array region and the staircase region by the same process, respectively. Each of the memory string structures and each of the dummy memory string structures include an epitaxial growth layer extending upward from the substrate.

However, in the current three-dimensional memory device, it is often found that the epitaxial growth layer of the dummy memory string structure in part of the staircase region has poor growth (for example, the epitaxial growth layer is distorted or insufficiently high). This may cause a short circuit and electrical problems such as current leakage.

SUMMARY OF THE INVENTION

The present invention relates to a semiconductor device. The body portion of the staircase region of the semiconductor device includes a first region and a second region. In the first region, the amount of conductive layers corresponding to the dummy memory string structures is between 1 and 10. In the second region, the amount of conductive layers corresponding to the dummy memory string structures is greater than 10. Since an area of the dummy memory string structures in the first region is larger than an area of the dummy memory string structures in the second region under an identical unit area (that is, an area of the first openings used to form the dummy memory string structures in the first region is greater than an area of the first openings used to form the dummy memory string structures in the second region) in a top view. During forming the dummy memory string structures including the epitaxial growth layer, the first region has a better effect of discharging the etching gas than the second region, and the adverse effect of the etching gas to the epitaxial growth layer in the first region can be reduced. Therefore, compared with the comparative example in which the area of the dummy memory string structures in the first region is not larger than the area of the dummy memory string structures in the second region, the epitaxial growth layer can have better growth conditions, which can prevent the epitaxial growth layer from being distorted or insufficiently high, thereby avoiding the problems of short circuit and leakage current.

According to an aspect of the present invention, a semiconductor device is provided. The semiconductor device includes a substrate, a stacked structure disposed on the substrate, and a plurality of dummy memory string structures. The stacked structure includes a plurality of insulating layers and a plurality of conductive layers alternately stacked with the insulating layers along a first direction. The dummy memory string structures are disposed in a staircase region of the semiconductor device and penetrate the stacked structure along a first direction. The staircase region includes a body portion and the body portion includes a first region and a second region adjacent to the first region. In the first region, an amount of conductive layers corresponding to the dummy memory string structures is between 1 and 10; in the second region, the amount of conductive layers corresponding to the dummy memory string structures is greater than 10. An area of the dummy memory string structures in the first region is greater than an area of the dummy memory string structures in the second region under an identical unit area in a top view.

According to another aspect of the present invention, a method for fabricating a semiconductor device is provided. A method for fabricating the semiconductor device includes the following steps. First, a substrate and a stacked structure disposed on the substrate are provided. Thereafter, a plurality of first openings are formed in a staircase region of the semiconductor device. The stacked structure includes a plurality of insulating layers and a plurality of conductive layers alternately stacked with the insulating layers along a first direction. The first openings penetrate the stacked structure along a first direction, wherein the staircase region includes a body portion, and the body portion includes a first region and a second region adjacent to the first region. In the first region, an amount of conductive layers corresponding to the first openings is between 1 and 10; in the second region, an amount of conductive layers corresponding to the first openings is greater than 10. An area of the first openings in the first region is greater than an area of the first openings in the second region under the identical unit area in a top view.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIGS. 1A-2B are flowcharts of a method for fabricating a semiconductor device according to an embodiment of the present invention;

DETAILED DESCRIPTION OF THE INVENTION

In the following detailed description, for ease of explanation, various specific details are provided to understand the embodiments of the present disclosure as a whole. It should be understood, however, that one or more embodiments can be implemented without employing these specific details. In other cases, in order to simplify the drawings, known structures and components are represented by schematic diagrams.

Figure 1A:
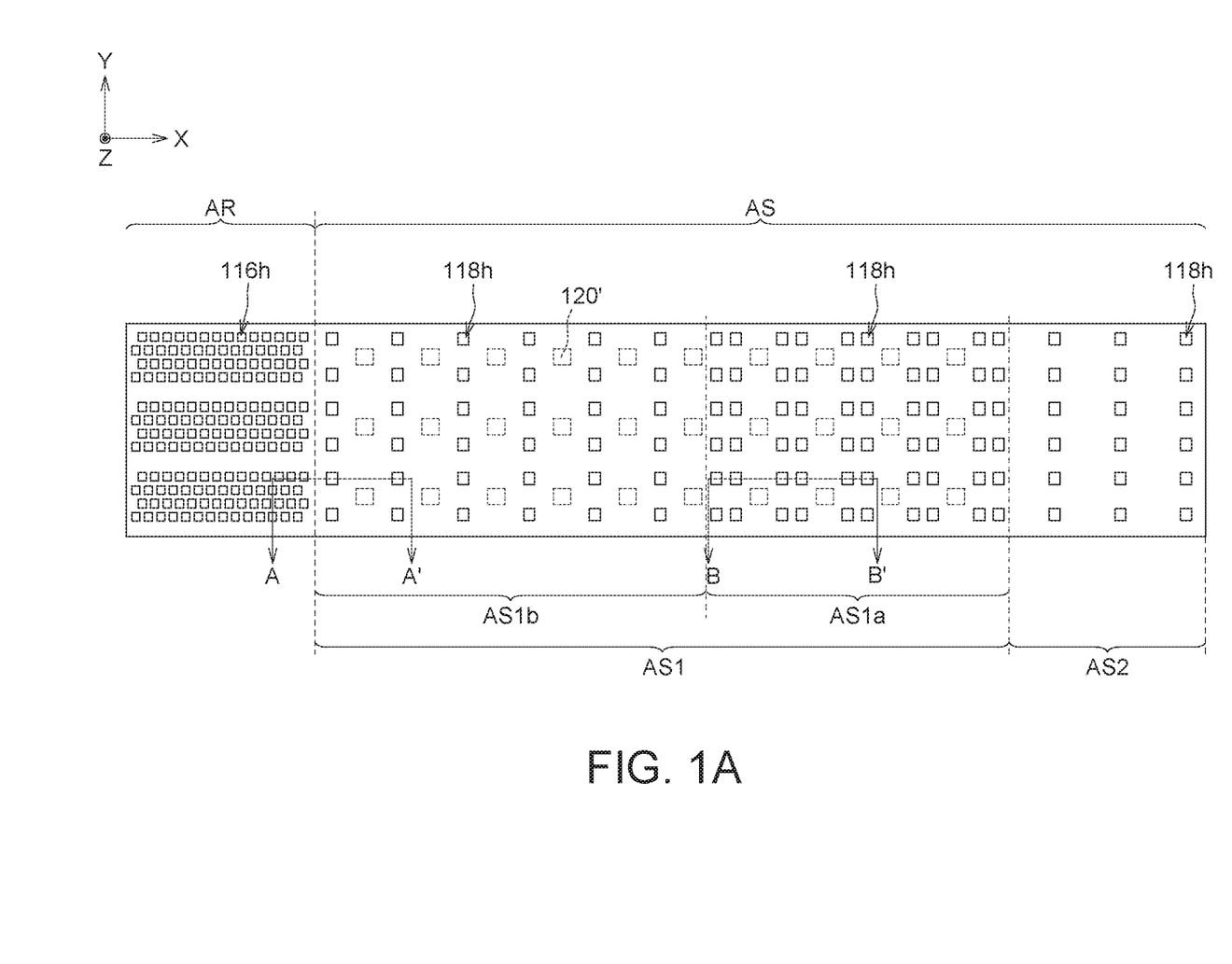
Figure 1B:
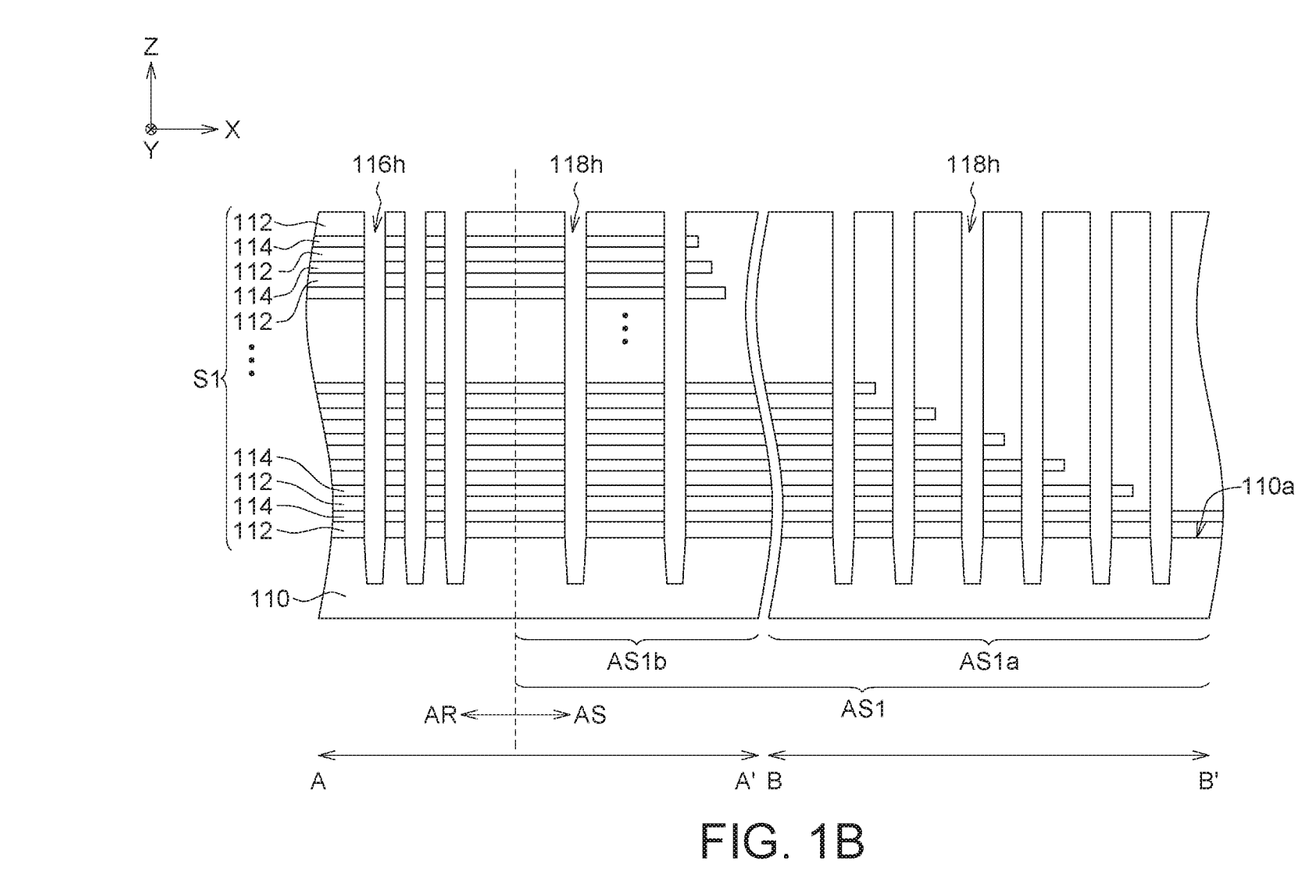
Figure 2A:
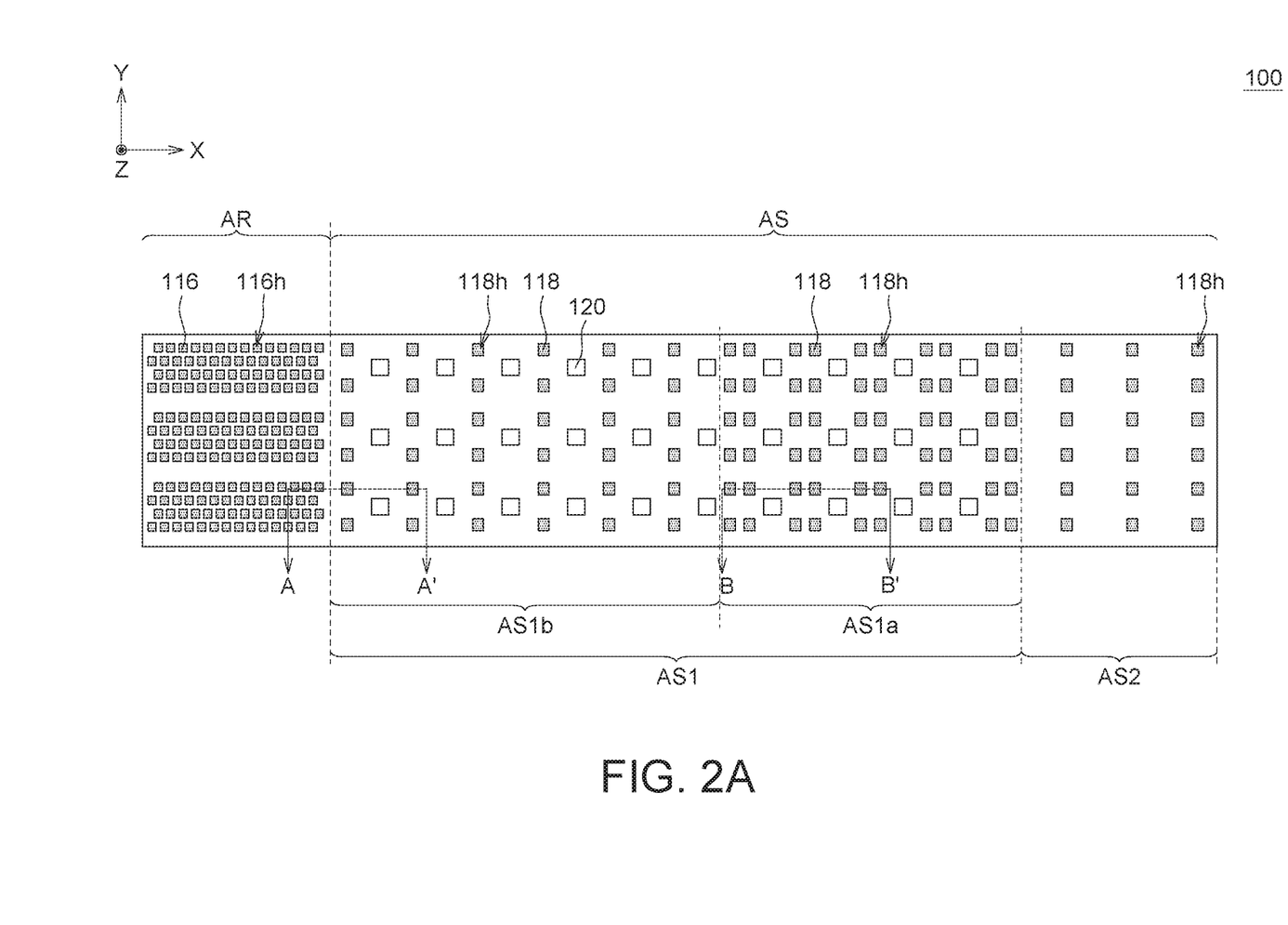
Figure 2B:
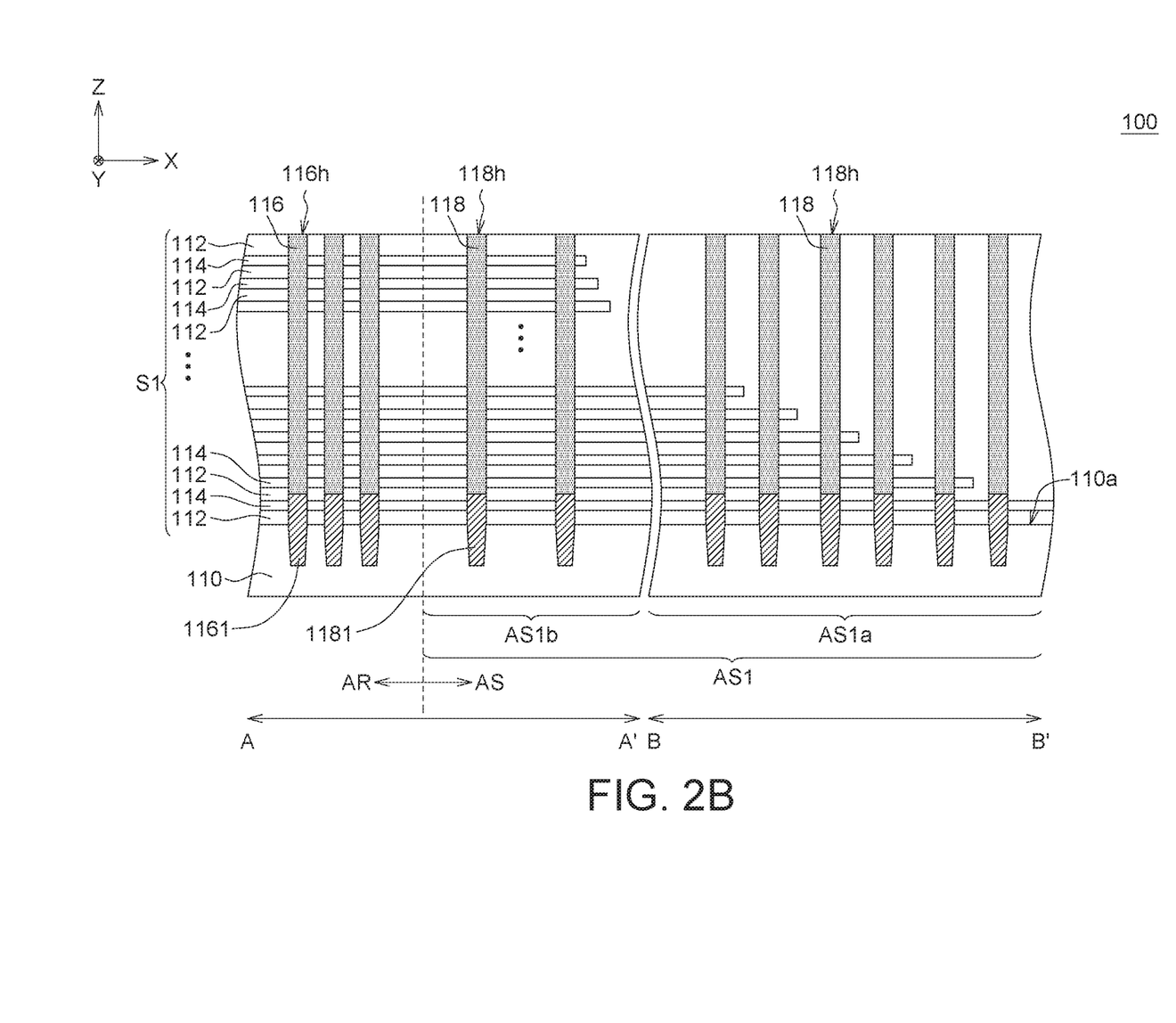

FIGS. 1A to 2B are flowcharts illustrating a method for fabricating a semiconductor device 100 according to an embodiment of the present invention. FIGS. 1A and 2A are top views of a manufacturing process of a semiconductor device 100 according to an embodiment of the present invention. FIG. 1B shows a cross-sectional view taken along line A-A' and line B-B' of FIG. 1A. FIG. 2B shows a cross-sectional view taken along line A-A' and line B-B' of FIG. 2A.

Referring to FIGS. 1A and 1B together, a substrate 110 and a stacked structure S1 disposed on the substrate 110 are provided. The stacked structure S1 is disposed on an upper surface 110a of the substrate 110 along the first direction (for example, the Z direction). The stacked structure S1 includes a plurality of insulating layers 112 and a plurality of conductive layers 114 alternately stacked with the insulating layers 112 along the first direction (for example, the Z direction). Next, the conductive layers 114 are trimmed through a general memory process so that the edge portions of the conductive layers 114 have a staircase structure to form a semiconductor device 100 including an array region AR and a staircase region AS. Thereafter, a plurality of array openings 116h and a plurality of first openings 118h are respectively formed in the array region AR and the staircase region AS by a same process, for example, an etching process. The array openings 116h and the first openings 118h penetrate the stacked structure S1 along the first direction (for example, the Z direction), and expose the substrate 110.

The staircase region AS includes a body portion AS1 which is electrically connected to the array region AR and a dummy portion AS2 which is not electrically connected to the array region AR. In the top view, the first openings 118h are staggered with the predetermined contact structure positions 120' of the body portion AS1. In addition, the body portion AS1 of the staircase region AS includes a first region AS1a and a second region AS1b adjacent to the first region AS1a. Since the conductive layers 114 of the body portion AS1 of the staircase region AS has a staircase structure, the amounts of the conductive layers 114 corresponding to the first openings 118h in different regions are different. In the first region AS1a, the amount of the conductive layers 114 corresponding to the first openings 118h is between 1 and 10, that is, the first region AS1a is corresponding to a region in which 1 to 10 layer(s) of bottommost conductive layer(s) 114 (closest to the substrate 110) is/are penetrated by the first openings 118h. In the second region AS1b, the amount of the conductive layers 114 corresponding to the first openings 118h is greater than 10, that is, the second region AS1b is corresponding to the region in which greater than 10 layers of the bottommost conductive layers 114 (closest to the substrate 110) are penetrated by the first openings 118h. For example, in the first region AS1a, when the amount of the conductive layers 114 corresponding to the first openings 118h is 10, the region above the tenth layer of the conductive layer 114 counted from the bottom is filled with an insulating material without a conductive layer; when the amount of the conductive layers 114 corresponding to the first openings 118h is 5, the region above the fifth layer of the conductive layer 114 counted from the bottom is filled with an insulating material without a conductive layer, and so on. In the second region AS1b, when the amount of the conductive layers 114 corresponding to the first openings 118h is 11, a region above the eleventh layer of the conductive layer 114 counted from the bottom is filled with an insulating material without a conductive layer; when the amount of the conductive layers 114 corresponding to the first openings 118h is 15, a region above the fifteenth layer of the conductive layer 114 counted from the bottom is filled with an insulating material without a conductive layer, and so on. Therefore, when "the amount of the conductive layers 114 corresponding to the first openings 118h in the first region AS1a is between 1 and 10" is described, it means that the first openings 118h in the first region AS1a exists in an environment where an amount of the conductive layers 114 counted from the bottom is between 1 and 10; when "the amount of the conductive layers 114 corresponding to the first openings 118h in the second region AS1b is greater than 10" is described, it means that the first openings 118h in the second region AS1b exists in an environment where the amount of the conductive layers 114 counted from the bottom is greater than 10; further, the first openings 118h in the first region AS1a and the first openings 118h in the second region AS1b may have a same depth.

From the perspective of the top view, a pattern formed by the first openings 118h in the first region AS1a is different from a pattern formed by the first openings 118h in the second region AS1b. In detail, an area of the first openings 118h of the first region AS1a is greater than an area of the first openings 118h of the second region AS1b under an identical unit area in t top view. According to the present embodiment, an amount of the first openings 118h in the first region AS1a is greater than an amount of the first openings 118h in the second region AS1b under an identical unit area, and an area of each of the first openings 118h in the first region AS1a is equal to an area of the first openings 118h in the second region AS1b in a top view. For example, the amount of the first openings 118h in the first region AS1a is twice the amount of the first openings 118h in the second region AS1b under the identical unit area, but the present invention is not limited thereto. In other embodiments, the amount of the first openings 118*h* in the first region AS1*a* may be three times or more than three times the amount of the first openings 118*h* in the second region AS1*b* under the identical unit area; an area of each of the first openings 118*h* in the first region AS1*a* may be different from an area of the first openings 118*h* in the second region AS1*b* in a top view, for example, an area of each of the first openings 118*h* in the first region AS1*a* may be greater than an area of the first openings 118*h* in the second region AS1*b* in a top view.

FIG. 1B exemplarily illustrates only eight conductive layers 114, but the present invention is not limited thereto. The stacked structure S1 may include more than eight conductive layers 114, which are adjusted according to requirements. In one embodiment, the stacked structure S1 may include 60 conductive layers 114.

In some embodiments, the substrate 110 may be a silicon substrate or other suitable substrates. The insulating layers 112 may be formed of an oxide, such as silicon dioxide ($SiO_2$). The conductive layers 114 may be formed of a conductive material, such as tungsten (W), aluminum (Al), titanium nitride (TiN), tantalum nitride (TaN), doped or undoped poly-silicon or other suitable materials. The insulating layers 112 and the conductive layers 114 may be formed by a deposition process, respectively. The deposition process for forming the insulating layers 112 is, for example, the Plasma Enhanced Chemical Vapor Deposition (PECVD), for example, using reactive gases such as silane ($SiH_4$) and nitrous oxide ($N_2O$). When the PECVD method is used to form the insulating layers 112 made of silicon dioxide, the reaction formula is as follows:

$$SiH_4 + 2N_2O \rightarrow SiO_2 + 2N_2 + 2H_2 \quad \text{Formula 1}$$

In some embodiments, the gas (for example, nitrogen and hydrogen) generated in Formula 1 may remain in the substrate 110.

In some embodiments, the array openings 116*h* and the first openings 118*h* may be formed by an etching method, such as a dry etching method. In some embodiments, the substrate 110 may be overetched such that the bottoms of the array openings 116*h* and the first openings 118*h* are lower than the upper surface 110*a* of the substrate 110. However, the etching step may react with the gas remaining in the substrate 110 to generate a by-product of ammonia ($NH_3$). Ammonia ($NH_3$) will be detrimental to the subsequent formation of the epitaxial growth layers 1161 and 1181 (shown in FIG. 2B). In particular, compared with the second region AS1*b*, the substrate 110 in the first region AS1*a* may have a higher concentration of ammonia.

According to the present embodiment, since the area of the first openings 118*h* of the first region AS1*a* is greater than the area of the first openings 118*h* of the second region AS1*b* under an identical unit area, the first region AS1*a* has more pathways for discharging the etching gas (such as ammonia) (through the first openings 118*h*) in comparison with the second region AS1*b*. The effect of discharging the etching gas (such as ammonia) in the first region AS1*a* is better than that of the second region AS1*b*. Therefore, the adverse effect to the epitaxial growth layers 1161 (shown in FIG. 2B) of the first region AS1*a* caused by the etching gas can be reduced.

After that, referring to FIGS. 2A and 2B simultaneously, memory string structures 116 and dummy memory string structures 118 are formed in the array openings 116*h* and the first openings 118*h*, respectively. Among them, each of the memory string structures 116 and each of the dummy memory string structures 118 include an epitaxial growth layer 1161 and 1181, respectively. The epitaxial growth layers 1161 and 1181 extend from the substrate 110 in a first direction (e.g., the Z direction). The epitaxial growth layers 1161 and 1181 are, for example, epitaxial growth layers of silicon (Si). Next, the contact structures 120 are formed at the predetermined contact structure positions 120' of the body portion AS1. The contact structures 120 are disposed in the body portion AS1 of the staircase region AS, and the contact structures 120 disposed in the body portion AS1 are electrically connected to the corresponding conductive layers 114 respectively. The dummy memory string structures 118 of the dummy portion AS2 are structures for supporting the semiconductor device 100 and are not electrically connected to other devices or components.

According to an embodiment of the present invention, an area of the dummy memory string structures 118 in the first region AS1*a* is greater than the area of the dummy memory string structures 118 in the second region AS1*b* under the identical unit area in a top view. Moreover, the amount of the dummy memory string structures 118 in the first region AS1*a* may be greater than the amount of the dummy memory string structures 118 in the second region AS1*b* under the identical unit area (for example, twice).

In some embodiments, the memory string structures 116 and the dummy memory string structures 118 include the same structures and materials. For example, in addition to the epitaxial growth layers 1161 and 1181, the memory string structures 116 and the dummy memory string structures 118 further include a memory layer, a channel layer, and an insulating pillar (not shown). In some embodiments, the memory string structures 116 and the dummy memory string structures 118 may have different sizes.

In some embodiments, the memory string structures 116, the array openings 116*h*, the dummy memory string structures 118, the first openings 118*h* and the contact structures 120 have a rectangular cross-section. In other embodiments, the cross-sections of the memory string structures 116, the array openings 116*h*, the dummy memory string structures 118, the first openings 118*h* and the contact structures 120 may have a circular shape, oval shape, or other suitable geometry.

In some embodiments, the bottommost conductive layers 114 (i.e., the conductive layers 114 closest to the substrate 110) of the conductive layer 114 may be used as the ground selection lines. The conductive layers 114 in the middle portion of the stacked structure S1 may be used as the word lines. The topmost conductive layers 114 (that is, the conductive layers 114 farthest from the substrate 110) can be used as string selection lines.

Since the area of the dummy memory string structures 118 in the first region AS1*a* is greater than the area of the dummy memory string structures 118 in the second region AS1*b* (that is, the area of the first openings 118*h* of the first region AS1*a* for forming the dummy memory string structures 118 is greater than the area of the first openings 118*h* of the second region AS1*b* for forming the dummy memory string structures 118) under the identical unit area in a top view, during forming the dummy memory string structures 116 and 118 including the epitaxial growth layers 1161 and 1181, the effect of discharging the etching gas in the first region AS1*a* is better than that of the second region AS1*b*, and the adverse effect to the epitaxial growth layers 1181 of the first region AS1*a* caused by the etching gas can be reduced. Therefore, compared with the comparative example in which the area of the dummy memory string structures of the first region is not greater than the area of the dummy memory string structures of the second region, the epitaxial growth layer 1181 of the dummy memory string structures 118 of the first region AS1a of the present embodiment can have better growth conditions, which can prevent the epitaxial growth layers 1181 from being distorted or insufficiently high, thereby avoiding short circuit and leakage current problems (such as a short circuit between the poorly grown epitaxial growth layers and the ground selection line).

In the present embodiment, even in the first region AS1a, the heights of the epitaxial growth layers 1181 may be greater than the height of the top surface of the conductive layer 114 which is the first layer in the conductive layers closest to the substrate 110.

Figure 3A:
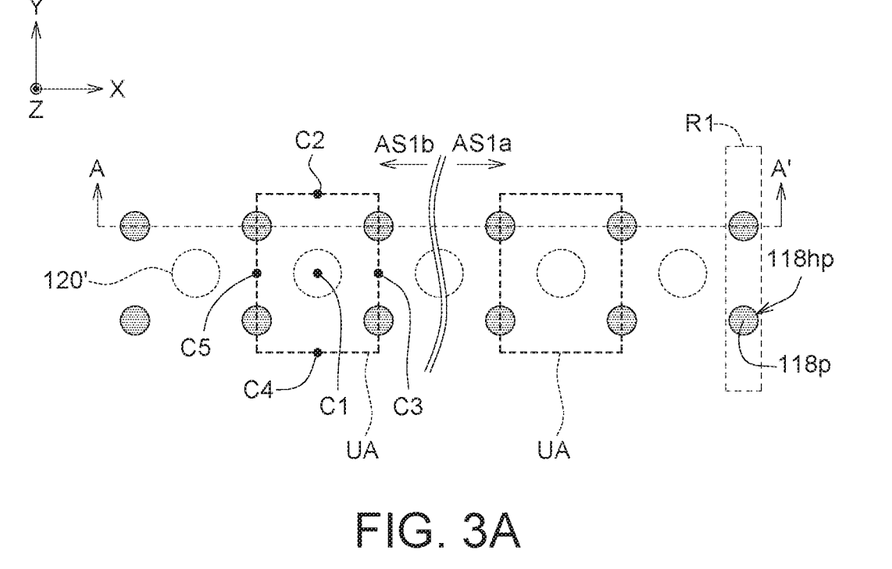
FIG. 3A is a partial top view of a semiconductor device according to a comparative example.
Figure 3B:
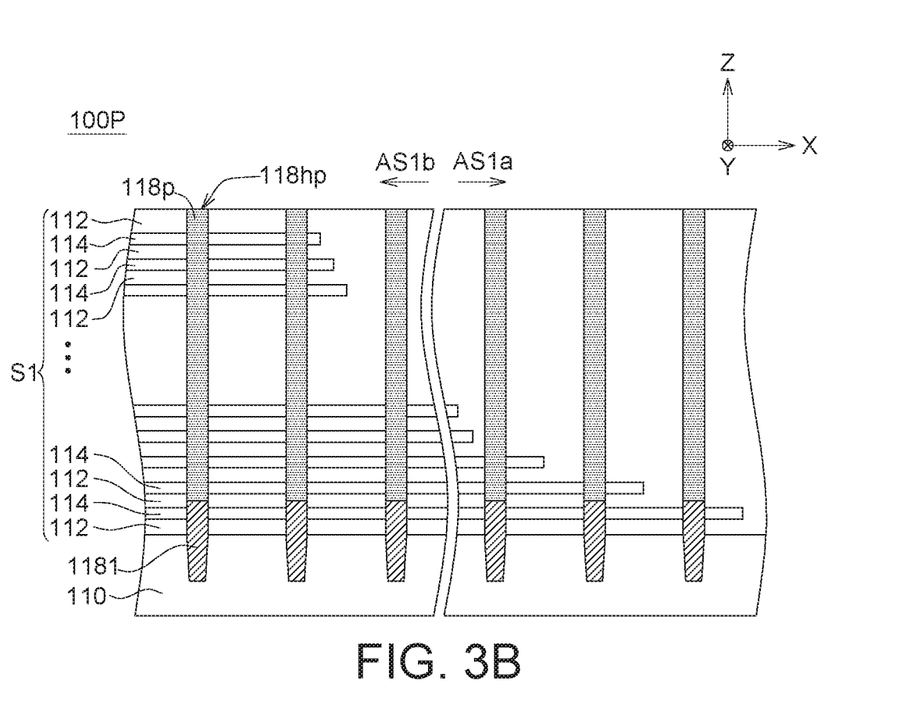
FIG. 3B is a cross-sectional view taken along line A-A of FIG. 3A.
Figure 4A:
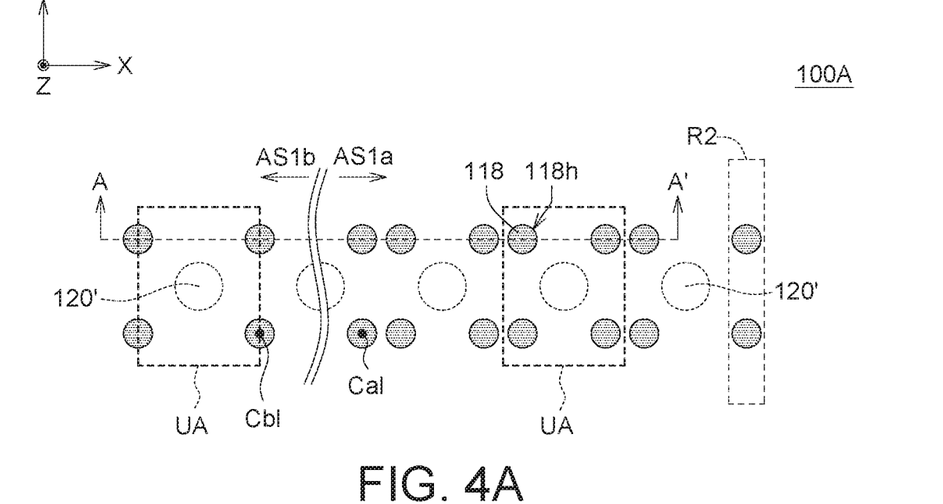
FIG. 4A is a partial top view of a semiconductor device according to an embodiment of the present invention.
Figure 4B:
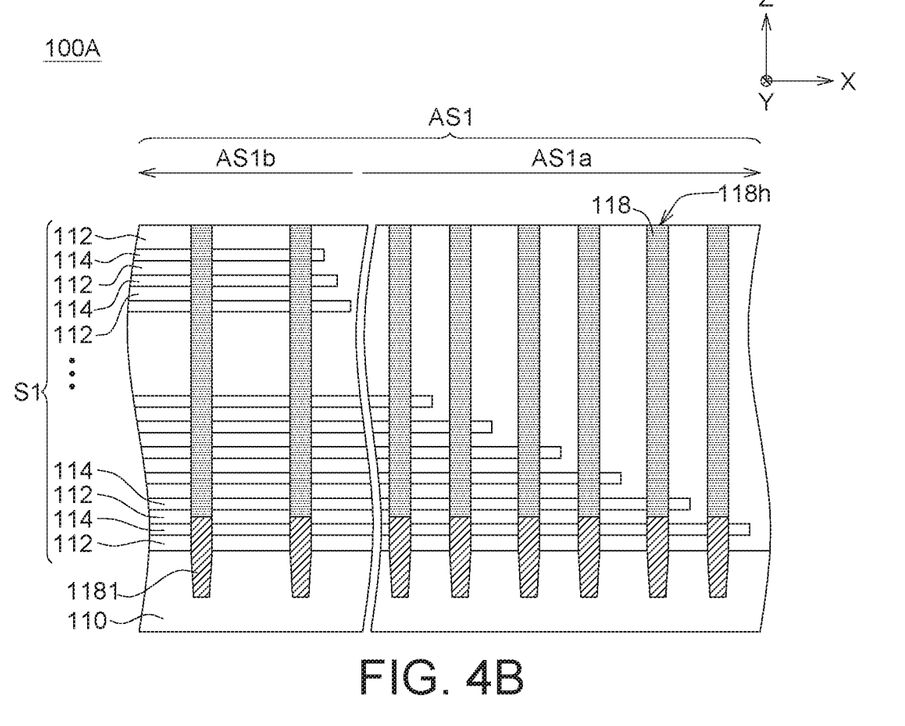
FIG. 4B is a cross-sectional view taken along line A-A' line of FIG. 4A.

FIG. 3A is a partial top view of a semiconductor device 100P according to a comparative example. FIG. 3B is a cross-sectional view taken along line A-A' of FIG. 3A. FIG. 4A is a partial top view of a semiconductor device 100A according to an embodiment of the present invention. FIG. 4B is a cross-sectional view taken along line A-A' of FIG. 4A. The semiconductor device 100A of the present invention is similar to the semiconductor device 100, except that the shapes of the cross-sections of memory string structures 116, the array openings 116h, the dummy memory string structures 118, the first openings 118h and the contact structures 120 between the semiconductor device 100A and the semiconductor device 100 are different.

The semiconductor device 100P of the comparative example is different from the semiconductor device 100A of the present invention in the pattern of the first openings 118hp (or the dummy memory string structures 118p) in the first region AS1a, and other structures are the same or similar. That is, the first openings 118hp (or the dummy memory string structures 118p) have the same pattern in the first region AS1a and the second region AS1b (as shown in FIG. 3A), and the first openings 118h (or the dummy memory string structures 118) have different patterns in the first region AS1a and the second region AS1b (as shown in FIG. 4A). More precisely, from the top view of FIG. 3A, under the identical unit area UA, the area of the first openings 118hp (or the dummy memory string structures 118p) of the first region AS1a is equal to the area of the first openings 118hp (or the dummy memory string structures 118p) of the second region AS1b. In contrast, from the top view of FIG. 4A, under the identical unit area UA, the area of the first openings 118h (or the dummy memory string structures 118) of the first region AS1a is greater than the area of the first openings 118h (or the dummy memory string structures 118) of the second region AS1b. In the present embodiment, the unit area UA is, for example, an rectangular area regarding the center point C1 of the predetermined contact structure position 120' as the center point, extending in the second direction (for example, the X direction) and the third direction (Y direction) to and surrounded by the center points C2~C5 between the two adjacent predetermined contact structure positions 120'. In other words, from the top view of FIG. 3A, under the identical unit area UA, the area of the first openings 118hp (or the dummy memory string structures 118p) of the first region AS1a is a total area of 2 first openings 118hp (or the dummy memory string structures 118p) (½*4=2); the area of the first openings 118hp (or the dummy memory string structures 118p) of the second region AS1b is also a total area of 2 first openings 118hp (or the dummy memory string structures 118p) (½*4=2). From the top view of FIG. 4A, under the identical unit area UA, the area of the first openings 118h (or the dummy memory string structures 118) of the first region AS1a is a total area of 4 first openings 118h (or the dummy memory string structures 118); the area of the first openings 118h (or the dummy memory string structures 118) of the second region AS1b is a total area of 2 first openings 118h (or the dummy memory string structures 118)(½*4=2). In the present embodiment, under the identical unit area UA, the area of the first openings 118h in the first region AS1a is twice the area of the first openings 118h in the second region AS1b, but the present invention is not limited thereto. In the present embodiment, each of the first openings 118h has the same area, but the present invention is not limited thereto.

According to some embodiments of the present invention, under the identical unit area UA, the amount of the first openings 118h (or the dummy memory string structures 118) of the first region AS1a is greater than the amount of the first openings 118h (or the dummy memory string structures 118). For example, in the first region AS1a and the second region AS1b of the semiconductor device 100P, a plurality of first openings 118hp (or the dummy memory string structures 118p) are disposed along the third direction (for example, the Y direction) as a row (such as a row R1 of first openings 118hp (or the dummy memory string structures 118p)) and are disposed in multiple rows along the second direction (for example, the X direction), and a row of first openings 118hp (or a dummy memory string structures 118p) disposed along a third direction (for example, the Y direction) are disposed between adjacent two rows of predetermined contact structure positions 120' disposed along the third direction (for example, the Y direction). In the semiconductor device 100, a plurality of first openings 118h (or the dummy memory string structures 118) are disposed in a row (such as a row R2 of first openings 118h (or the dummy memory string structures 118)) along a third direction (for example, the Y direction), and are disposed in multiple rows along the second direction (for example, X direction). In the first region AS1a, two rows of first openings 118h (or the dummy memory string structures 118) disposed along the third direction (for example, the Y direction) are disposed between two adjacent rows of predetermined contact structure positions 120' disposed along the third direction (for example, the Y direction). In the second region AS1b, one row of first openings 118h (or the dummy memory string structures 118) disposed along the third direction (for example, the Y direction) are disposed between two adjacent rows of predetermined contact structure positions 120' disposed along the third direction (for example, the Y direction). In the present embodiment, under the identical unit area UA, the amount of the first openings 118h (or the dummy memory string structures 118) in the first region AS1a is twice the amount of the first openings 118h (or the dummy memory string structures 118) in the second region AS1b, but the present invention is not limited thereto.

In the present embodiment, the first openings 118h (or the dummy memory string structures 118) are disposed on the substrate 110 along a second direction (such as X direction), and the second direction is perpendicular to the first direction. In the second direction, the center points Ca1 of the first openings 118h (or the dummy memory string structures 118) disposed in the first region AS1a are aligned with the center points Cb1 of the first openings 118h (or the dummy memory string structures 118) disposed in the second region AS1b.

According to some embodiments of the present invention, in a top view, when an area ratio of the total area of the first openings 118h (or the dummy memory string structures 118) to the total area of the staircase region AS is equal to or greater than 8%, the gas that is not suitable for the growth of the epitaxial growth layer can be effectively released, so that the epitaxial growth layer 1181 in the first region AS1a of the present invention can still have a good growth situation. For example, in the semiconductor device 100P of the comparative example, from the perspective of the top view, an area ratio of the total area of the first openings 118hp (or the dummy memory string structures 118p) to the total area of the staircase region AS1 is equal to 5.44%. In the semiconductor device 100A according to an embodiment of the present invention, the area ratio of the total area of the first openings 118h (or the dummy memory string structures 118) to the total area of the staircase region AS is equal to 8.99%.

Figure 5:
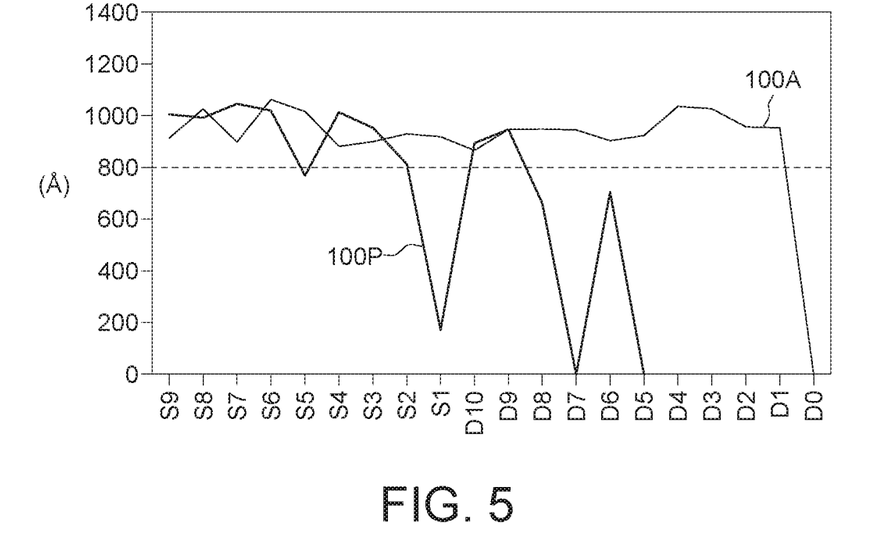
FIG. 5 is a graph showing heights of epitaxial growth layers of dummy memory string structures of a semiconductor device according to an embodiment of the present invention and a semiconductor device of a comparative example.

FIG. 5 is a graph showing the heights of the epitaxial growth layers of the dummy memory string structures of the semiconductor device 100A according to an embodiment of the present invention and the semiconductor device 100P of a comparative example.

FIG. 5 is results measuring epitaxial growth layers of dummy memory string structures with corresponding positions in the semiconductor device 100A and the semiconductor device 100P. The height of the epitaxial growth layer is, for example, defined as the vertical height between the upper surface 110a of the substrate 110 and a top surface of the epitaxial growth layer. The X coordinate represents the amount of the dummy memory string structures, wherein S1 to S9 represent the amount of the dummy memory string structures of the first region AS1a of the body portion AS1, and D0 to D10 represent the amount of the dummy memory string structures of the dummy portion AS2.

Generally, when a height of the epitaxial growth layer is equal to or greater than 800 Angstroms (Å), a good electrical effect can be obtained. As can be seen from the results of FIG. 5, in the first region AS1a of the semiconductor device 100P, the heights of the epitaxial growth layers of at least the dummy memory string structures of numbers S5 and S1 are less than 800 Angstroms. In the first region AS1a of the semiconductor device 100A according to an embodiment of the present invention, the heights of the epitaxial growth layers 1181 of all the dummy memory string structures 118 are greater than 800 angstroms.

Figure 6A:
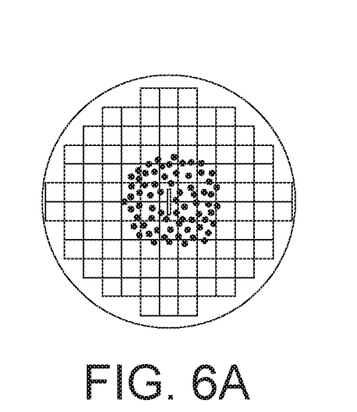
FIG. 6A is a scanning result of epitaxial growth layers of abnormal dummy memory string structures of a semiconductor device of the comparative example.
Figure 6B:
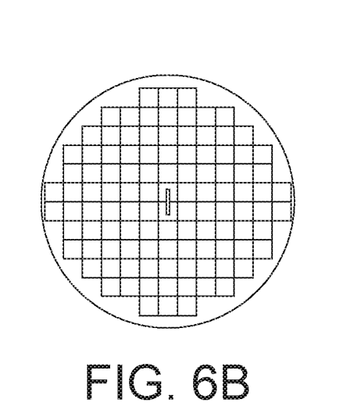
FIG. 6B illustrates a scanning result of epitaxial growth layers of abnormal dummy memory string structures of a semiconductor device according to an embodiment of the present invention.

FIG. 6A illustrates a scanning result of the epitaxial growth layers of the abnormal dummy memory string structure of the semiconductor device 100P of the comparative example. FIG. 6B illustrates a scanning result of the epitaxial growth layers of the abnormal dummy memory string structure of the semiconductor device 100A according to an embodiment of the present invention.

Referring to FIGS. 6A and 6B, if a height of the epitaxial growth layer of the dummy memory string structure is less than 200 angstroms, the epitaxial growth layer of the dummy memory string structure is marked by a black dot as abnormal. FIG. 6A shows some abnormal epitaxial growth layers of dummy memory string structures in the semiconductor device 100P of the comparative example; FIG. 6B shows that there is no abnormal epitaxial growth layer of the dummy memory string structure in the semiconductor device 100A according to an embodiment of the present invention.

As can be seen from the results of FIGS. 5 to 6B, compared to the semiconductor device 100P of the comparative example, since the area of the first openings 118h (or the dummy memory string structures 118) of the first region AS1a of the semiconductor device 100A of the present invention is greater than the area of the first opening 118h (or the dummy memory string structures 118) of the second region AS1b (under the same unit area UA), the gas in the substrate 110 that is not suitable for the growth of the epitaxial growth layer can be effectively exhausted. Even the epitaxial growth layers 1181 of the dummy memory string structures 118 in the first region AS1a can have better growth conditions, thereby avoiding the problems of short circuit and leakage current mentioned above.

Figure 7:
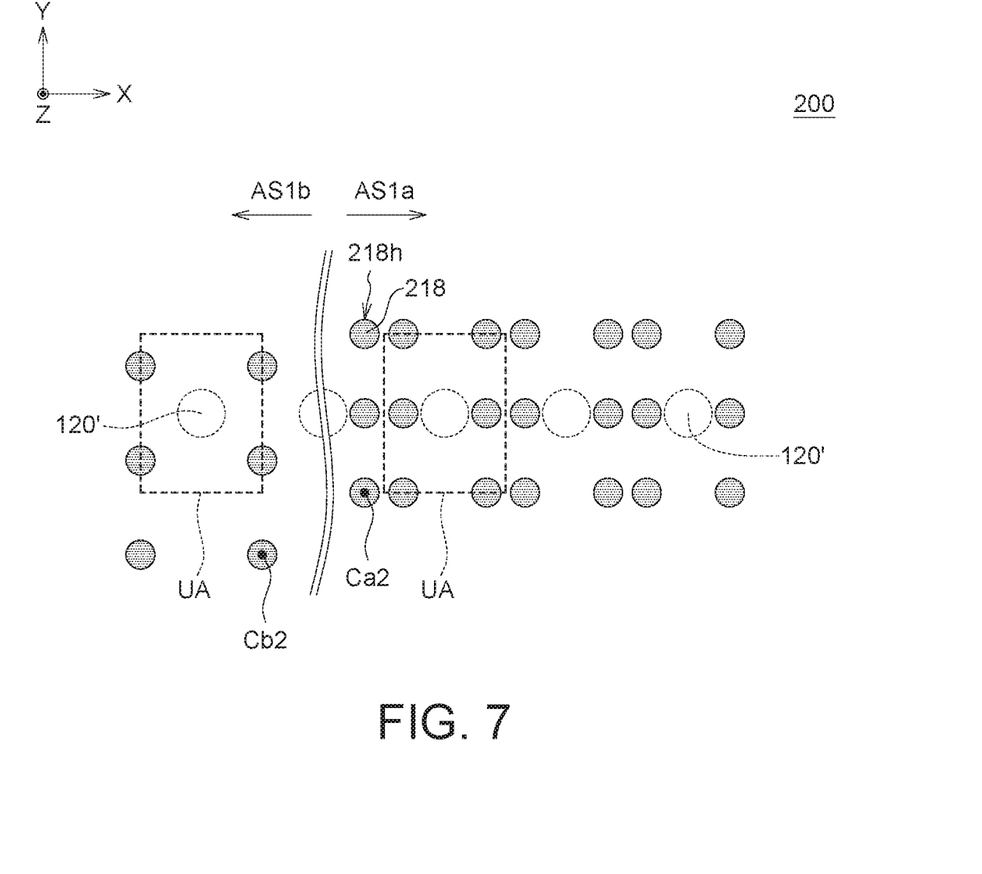
FIG. 7 is a partial top view of a semiconductor device according to another embodiment of the present invention.

FIG. 7 is a partial top view of a semiconductor device 200 according to another embodiment of the present invention.

Referring to FIG. 7, under the identical unit area UA, the area of the first openings 218h (or the dummy memory string structures 218) of the first region AS1a is greater than the area of the first openings 218h (or the dummy memory string structures 218) of the second region AS1b. The semiconductor device 200 is similar to the semiconductor device 100A, except that the pattern of the first openings 218h (or the dummy memory string structures 218) of the first region AS1a (as shown in FIG. 7) is different from the pattern of the first openings 118h (or the dummy memory string structures 118) of the first region AS1a (as shown in FIG. 4A). Further, the first openings 218h (or the dummy memory string structures 218) are disposed on the substrate 110 along the second direction (for example, the X direction) and the third direction (for example, the Y direction). The first direction, the second direction and the third direction are, for example, perpendicular to each other. The center points Ca2 of the first openings 218h (or the dummy memory string structures 218) disposed in the first region AS1a and the center points Cb2 of the first openings 218h (or the dummy memory string structures 218) disposed in the second region AS1b are staggered in the second direction.

In the semiconductor devices 100A and 200, the center points Ca1 and Ca2 of the first openings 118h and 218h (or the dummy memory string structures 118 and 218) of the first region AS1a are aligned with each other along the second direction, but the present invention is not limited thereto. In other embodiments, the center points Ca1 and Ca2 of two adjacent rows of the first openings 118h and 218h (or the dummy memory string structures 118 and 218) of the first region AS1a can be staggered from each other in the second direction.

The amount and arrangement of the first openings 118h and 218h (or the dummy memory string structures 118 and 218) of the present invention can be arbitrarily adjusted, as long as the area of the first openings 118h and 218h (or dummy memory string structures 118 and 218) of the first region AS1a is greater than the area of the first openings 118h and 218h (or dummy memory string structures 118 and 218) of the second region AS1b under the identical unit area UA, it can be the scope of the present invention.

Figure 8A:
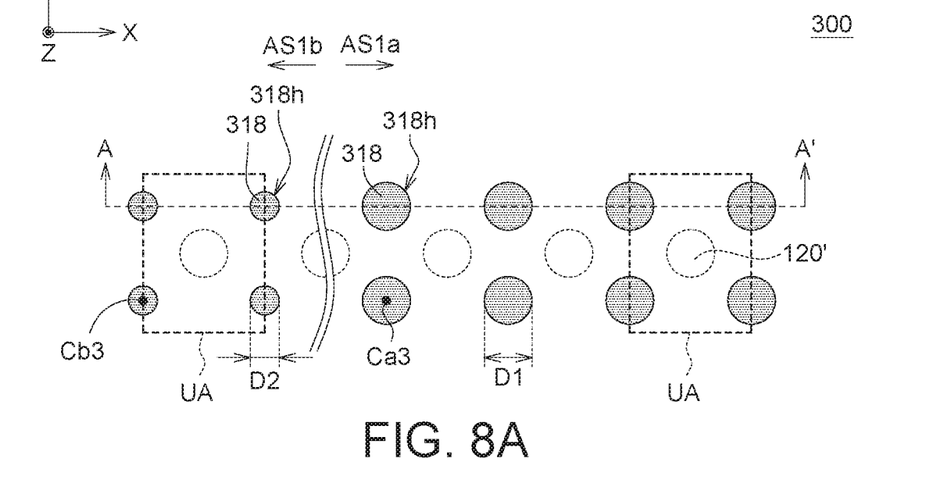
FIG. 8A is a partial top view of a semiconductor device according to further embodiment of the present invention.
Figure 8B:
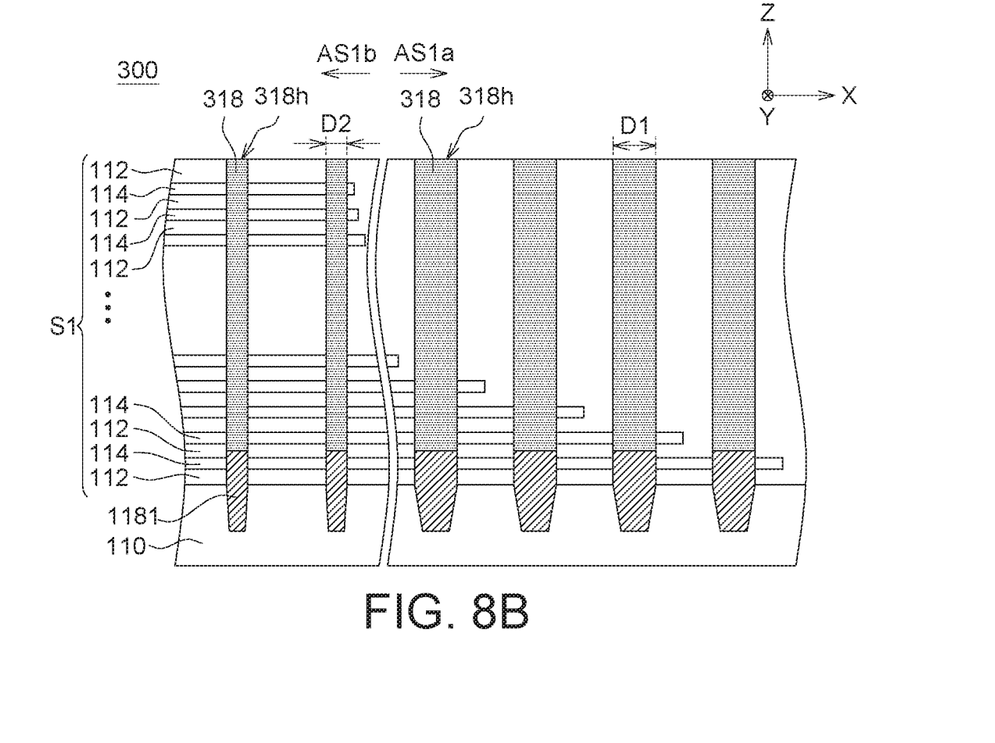
FIG. 8B is a cross-sectional view taken along line A-A of FIG. 8A.

FIG. 8A is a partial top view of a semiconductor device 300 according to further embodiment of the present invention. FIG. 8B shows a cross-sectional view taken along line A-A' of FIG. 8A.

Referring to FIGS. 8A and 8B at the same time, under the identical unit area UA, the area of the first openings 318h (or the dummy memory string structures 318) of the first region AS1a is greater than the area of the first openings 318h (or the dummy memory string structures 318) of the second region AS1b. The semiconductor device 300 is similar to the semiconductor device 100A, except that the pattern of the first openings 318h (or the dummy memory tandem structures 318) of the first region AS1a (as shown in FIG. 8A) is different from the pattern of the first openings 118h (or the dummy memory string structures 118) of the first region AS1a (as shown in FIG. 4A). Further, a diameter D1 of the first openings 318h (or the dummy memory string structures 318) of the first region AS1a is greater than a diameter D2 of the first openings 318*h* (or the dummy memory string structures 318) of the second region AS1*b*. In an embodiment, the diameter D1 of the first openings 318*h* (or the dummy memory string structures 318) of the first region AS1*a* is greater than the diameter D2 of the first openings 318*h* (or the dummy memory string structures 318) of the second region AS1*b* for more than 10%. For example, when the diameter D2 of the first openings 318*h* (or the dummy memory string structures 318) of the second region AS1*b* is 80 nm, the diameter D1 of the first openings 318*h* (or the dummy memory string structures 318) of the first region AS1*a* can be any value equal to or greater than 88 nm, such as 90 nm or 100 nm.

In some embodiments, the first openings 318*h* (or the dummy memory string structures 318) are disposed on the substrate 110 along the second direction (for example, the X direction) and the third direction (for example, the Y direction). The first direction, the second direction and the third direction may be perpendicular to each other. In the second direction, the center points Ca3 of the first openings 318*h* (or the dummy memory string structures 318) disposed in the first region AS1*a* are aligned with the center points Cb3 of the first openings 318*h* (or the dummy memory string structures 318) disposed in the second region AS1*b*.

Figure 9A:
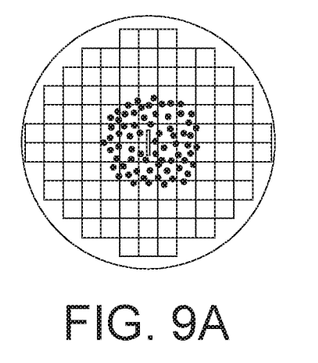
FIG. 9A illustrates a scanning result of epitaxial growth layers of abnormal dummy memory string structures of a semiconductor device of a comparative example.
Figure 9B:
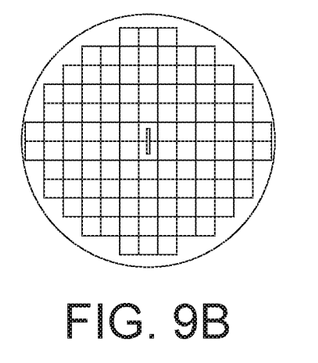
FIG. 9B illustrates a scanning result of epitaxial growth layers of abnormal dummy memory string structures of a semiconductor device according to an embodiment of the invention.
Figure 9C:
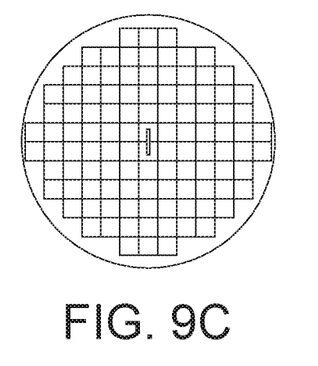
FIG. 9C illustrates a scanning result of epitaxial growth layers of abnormal dummy memory string structures of a semiconductor device according to another embodiment of the present invention.

FIG. 9A illustrates scanning results of the epitaxial growth layers of the abnormal dummy memory string structures of the semiconductor device 100P of the comparative example. FIG. 9B illustrates scanning results of the epitaxial growth layers of the abnormal dummy memory string structures of the semiconductor device 300 according to an embodiment of the present invention. FIG. 9C illustrates scanning results of the epitaxial growth layers of the abnormal dummy memory string structures of the semiconductor device 300 according to another embodiment of the present invention.

In the comparative example shown in FIG. 9A, a diameter of the first openings 118*hp* of the first region AS1*a* is 80 nm. In an embodiment of the semiconductor device 300 in FIG. 9B, a diameter of the first openings 318*h* of the first region AS1*a* is 90 nm. In another embodiment of the semiconductor device 300 in FIG. 9C, a diameter of the first openings 318*h* of the first region AS1*a* is 100 nm.

Referring to FIGS. 9A to 9C, if a height of the epitaxial growth layer of the dummy memory string structure is less than 200 angstroms, the epitaxial growth layer of the dummy memory tandem structure is marked by a black dot as abnormal. FIG. 9A shows some abnormal epitaxial growth layers of the dummy memory string structures in a semiconductor device 100P of a comparative example; FIGS. 9B and 9C show that there is no abnormal epitaxial growth layers of the dummy memory string structures in the semiconductor device 300.

Figure 10:
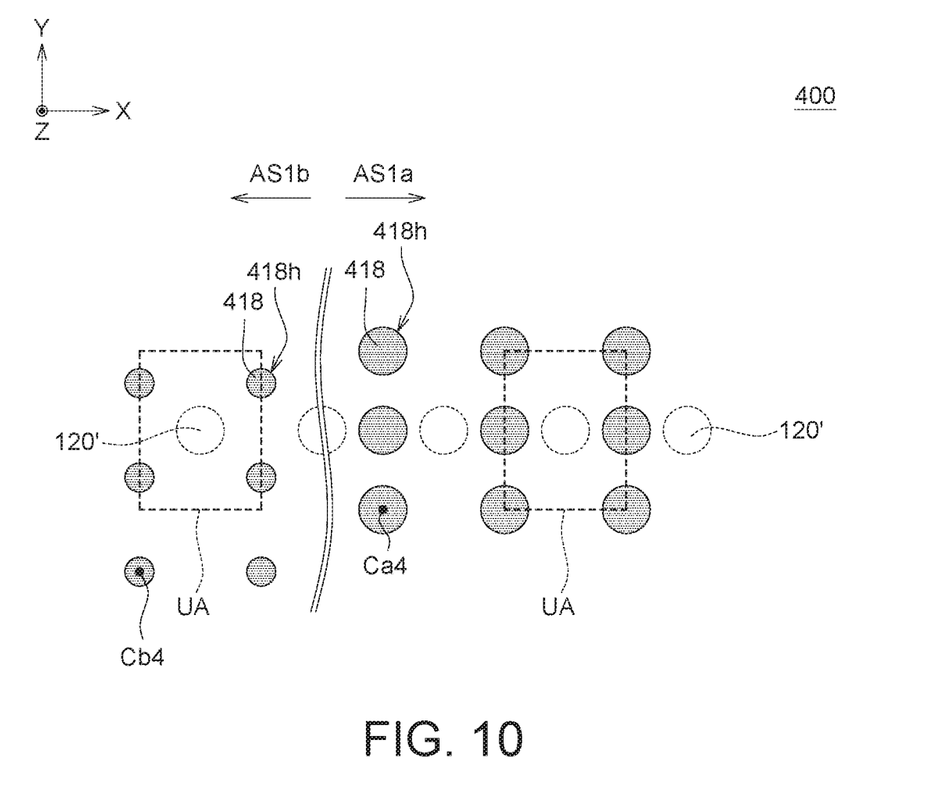
FIG. 10 is a partial top view of a semiconductor device according to further embodiment of the present invention.

FIG. 10 is a partial top view of a semiconductor device 400 according to further embodiment of the present invention.

Referring to FIG. 10, under the identical unit area UA, the area of the first openings 418*h* (or the dummy memory string structures 418) of the first region AS1*a* is greater than the area of the first openings 418*h* (or the dummy memory string structures 418) of the second region AS1*b*. The semiconductor device 400 is similar to the semiconductor device 300, except that the pattern of the first openings 418*h* (or the dummy memory string structures 418) of the first region AS1*a* (as shown in FIG. 10) is different from the pattern of the first openings 318*h* (or the dummy memory string structures 318) of the first region AS1*a* (as shown in FIG. 8A). Further, the first openings 418*h* (or the dummy memory string structures 418) are disposed on the substrate 110 along the second direction (for example, the X direction) and the third direction (for example, the Y direction). The first direction, the second direction and the third direction are, for example, perpendicular to each other. The center points Ca4 of the first openings 418*h* (or the dummy memory string structures 418) disposed in the first region AS1*a* and the center points Cb4 of the first openings 418*h* (or the dummy memory string structures 418) disposed in the second region AS1*b* are staggered in the second direction.

The amount and arrangement of the first openings 318*h* and 418*h* (or the dummy memory string structures 318 and 418) of the present invention can be arbitrarily adjusted, as long as the area of the first openings 318*h* and 418*h* (or dummy memory string structures 318 and 418) of the first region AS1*a* is greater than the area of the first openings 318*h* and 418*h* (or dummy memory string structures 318 and 418) of the second region AS1*b* under the identical unit area UA, it can be the scope of the present invention.

According to some embodiments of the present invention, under the identical unit area UA, it is only necessary to increase the area of the first openings 118*h* (or the dummy memory string structure 118) of the first region AS1*a* (for example, by increasing the amount or the diameter of the first openings 118*h* in the first region AS1*a*), and the effect of preventing the epitaxial growth layer from becoming distorted or insufficiently high can be achieved. It is not necessary to increase the areas of the first openings 118*h* (the dummy memory string structures 118) of the first region AS1*a* and the second region AS1*b* at the same time, so the cost can be greatly saved.

The present invention provides a semiconductor device and a method for fabricating the same. According to an embodiment, the semiconductor device includes a substrate, a stacked structure disposed on the substrate, and a plurality of dummy memory string structures. The stacked structure includes a plurality of insulating layers and a plurality of conductive layers alternately stacked with the insulating layers along a first direction. The dummy memory string structures are disposed in a staircase region of the semiconductor device and penetrate the stacked structure along a first direction. The staircase region includes a body portion and the body portion includes a first region and a second region adjacent to the first region. The amount of conductive layers penetrated by the dummy memory string structures is between 1 and 10 in the first region; the amount of conductive layers penetrated by the dummy memory string structures is greater than 10 in the second region. The area of the dummy memory string structure of the first region is greater than the area of the dummy memory string structure of the second region under an identical unit area.

Compared with the comparative example in which the area of the dummy memory string structure of the first region is not greater than the area of the dummy memory string structures of the second region (under the identical unit area), since the area of the dummy memory string structures of the first region of the semiconductor device in the present invention is greater than the area of the dummy memory string structures of the second region (under the identical unit area), the gas that is not suitable for the growth of the epitaxial growth layers can be more effectively released. Therefore, the epitaxial growth layers of the dummy memory string structures of the first region of the present invention can have better growth conditions, which can prevent the epitaxial growth layers from being distorted or insufficiently high, thereby avoiding some electrical problems such as short circuit and leakage current.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
a substrate and a stacked structure disposed on the substrate, stacked structure comprising a plurality of conductive layers and a plurality of insulating layers alternatively stacked with the conductive layers along a first direction; and
a plurality of dummy memory string structures disposed in a staircase region of the semiconductor device and penetrating the stacked structure along the first direction, wherein the staircase region includes a body portion and the body portion includes a first region and a second region adjacent to the first region; in the first region, an amount of the conductive layers corresponding to the dummy memory string structures is between 1 and 10; in the second region, an amount of the conductive layers corresponding to the dummy memory string structures is greater than 10,
wherein an area of the dummy memory string structures in the first region is greater than an area of the dummy memory string structures in the second region under an identical unit area in a top view; and
wherein a distance between the dummy memory string structures in the first region is smaller than a distance between the dummy memory string structures in the second region.

2. The semiconductor device according to claim 1, wherein an amount of the dummy memory string structures in the first region is greater than an amount of the dummy memory string structures in the second region under the identical unit area.

3. The semiconductor device according to claim 2, wherein the dummy memory string structures are disposed on the substrate along a second direction, and the second direction is perpendicular to the first direction,
wherein center points of the dummy memory string structures in the first region are aligned with center points of the dummy memory string structures in the second region in the second direction.

4. The semiconductor device according to claim 2, wherein the dummy memory string structures are disposed on the substrate along a second direction, and the second direction is perpendicular to the first direction,
wherein center points of the dummy memory string structures in the first region and center points of the dummy memory string structures in the second region are staggered in the second direction.

5. The semiconductor device according to claim 1, wherein a diameter of each of the dummy memory string structures in the first region is greater than a diameter of each of the dummy memory string structures in the second region.

6. The semiconductor device according to claim 5, wherein the diameter of each of the dummy memory string structures in the first region is greater than the diameter of each of the dummy memory string structures in the second region for 10% or more than 10%.

7. The semiconductor device according to claim 5, wherein the dummy memory string structures are disposed on the substrate along a second direction, and the second direction is perpendicular to the first direction,
wherein center points of the dummy memory string structures in the first region are aligned with center points of the dummy memory string structures in the second region in the second direction.

8. The semiconductor device according to claim 5, wherein the dummy memory string structures are disposed on the substrate along a second direction, and the second direction is perpendicular to the first direction,
wherein center points of the dummy memory string structures in the first region and center points of the dummy memory string structures in the second region are staggered in the second direction.

9. The semiconductor device according to claim 1, wherein in the top view, an area ratio of a total area of the dummy memory string structures to a total area of the staircase region is 8% or more than 8%.

10. The semiconductor device according to claim 1, further comprising a plurality of contact structures, wherein the contact structures are disposed in the staircase region, and the contact structures disposed in the body portion are respectively electrically connected to a corresponding one of the conductive layers.

11. The semiconductor device according to claim 1, wherein each of the dummy memory string structures includes an epitaxial growth layer, and the epitaxial growth layer extends from the substrate along the first direction.

12. A method for fabricating a semiconductor device, comprising:
providing a substrate and a stacked structure disposed on the substrate, the stacked structure comprising a plurality of conductive layers and a plurality of insulating layers alternatively stacked with the conductive layers along a first direction; and
forming a plurality of first openings in a staircase region of the semiconductor device and the first openings penetrating the stacked structure along the first direction, wherein the staircase region includes a body portion and the body portion includes a first region and a second region adjacent to the first region; in the first region, an amount of the conductive layers corresponding to the first openings is between 1 and 10; in the second region, an amount of the conductive layers corresponding to the first openings is greater than 10,
wherein an area of the first openings in the first region is greater than an area of the first openings in the second region under an identical unit area in a top view.

13. The method according to claim 12, wherein an amount of the first openings in the first region is greater than an amount of the first openings in the second region under the identical unit area.

14. The method according to claim 13, wherein the first openings are disposed on the substrate along a second direction, and the second direction is perpendicular to the first direction,
wherein center points of the first openings in the first region are aligned with center points of the first openings in the second region in the second direction.

15. The method according to claim 13, wherein the first openings are disposed on the substrate along a second direction, and the second direction is perpendicular to the first direction,
wherein center points of the first openings in the first region and center points of first openings in the second region are staggered in the second direction.

16. The method according to claim 12, wherein a diameter of each of the first openings in the first region is greater than a diameter of each of the first openings in the second region for 10% or more than 10%.

17. The method according to claim 12, wherein the first openings are disposed on the substrate along a second direction, and the second direction is perpendicular to the first direction,
   wherein center points of the first openings in the first region are aligned with center points of the first openings in the second region in the second direction.

18. The method according to claim 12, wherein the first openings are disposed on the substrate along a second direction, and the second direction is perpendicular to the first direction,
   wherein center points of the first openings in the first region and center points of the first openings in the second region are staggered in the second direction.

19. The method according to claim 12, wherein in the top view, an area ratio of a total area of the first openings to a total area of the staircase region is 8% or more than 8%.

20. The method according to claim 12, further comprising:
   forming a plurality of dummy memory string structures in the first openings, wherein each of the dummy memory string structures includes an epitaxial growth layer, and the epitaxial growth layer extends from the substrate along the first direction.

* * * * *